(12) United States Patent
Yang et al.

(10) Patent No.: US 7,254,026 B2
(45) Date of Patent: Aug. 7, 2007

(54) HEAT DISSIPATION DEVICE WITH HEAT PIPE

(75) Inventors: Ming Yang, Shenzhen (CN); Yeu-Lih Lin, Tucheng (TW); Chin-Lung Chen, Tucheng (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/308,385

(22) Filed: Mar. 20, 2006

(65) Prior Publication Data

US 2007/0115637 A1    May 24, 2007

(30) Foreign Application Priority Data

Nov. 18, 2005   (TW) ................ 094140619

(51) Int. Cl.
  *H05K 7/20* (2006.01)
  *B21D 53/92* (2006.01)
  *F28F 1/30* (2006.01)

(52) U.S. Cl. ............. 361/703; 361/700; 361/704; 165/182; 165/185; 29/890.03; 29/890.032

(58) Field of Classification Search ........ 361/703–704, 361/709–711, 700; 29/890.03, 890.032; 165/185, 80.5, 182
See application file for complete search history.

(56) References Cited

U.S. PATENT DOCUMENTS 3,693,710 A * 9/1972 Drosnin .................. 165/152
4,398,208 A * 8/1983 Murano et al. ........... 257/700
4,563,725 A * 1/1986 Kirby ...................... 361/708
4,968,962 A * 11/1990 Hohider et al. ............ 337/4
6,269,541 B1 * 8/2001 Iguchi et al. .......... 29/890.054
6,435,266 B1 * 8/2002 Wu ........................ 165/80.3
2005/0067149 A1 * 3/2005 Wu ....................... 165/104.11
2005/0155750 A1 * 7/2005 Mitchell et al. ........... 165/182
2006/0104033 A1 * 5/2006 Yeh et al. ................. 361/703

FOREIGN PATENT DOCUMENTS

JP           07032133 A   * 2/1995
WO       WO 96 34245    * 10/1996

* cited by examiner

*Primary Examiner*—Michael Datskovsky
*Assistant Examiner*—Robert J. Hoffberg
(74) *Attorney, Agent, or Firm*—Jeffrey T. Knapp

(57) ABSTRACT

A heat dissipation device (40) includes at least a heat pipe (45) and a plurality of metal fins (43) thermally connected to the heat pipe. Each of the metal fins defines therein an aperture (431). An extension flange (433) extends outwardly from the metal fin and surrounds the aperture. The extension flange defines therein a plurality of slits (435). The apertures and extension flanges of the metal fins are aligned together. The heat pipe is received in the aligned apertures and soldered by a thermal medium material to the metal fins via the aligned extension flanges. During the soldering process, rosin content contained in the thermal medium material can be discharged away via the slits formed in the extension flange.

10 Claims, 6 Drawing Sheets

HEAT DISSIPATION DEVICE WITH HEAT PIPE

FIELD OF THE INVENTION

The present invention relates generally to heat dissipation devices used for dissipating heat from heat generating components, and more particularly to a heat dissipation device that is combined with heat pipes.

DESCRIPTION OF RELATED ART

It is well known that heat is generated by electronic components during their normal operations. A central processing unit (CPU) installed in a computer system generates a large amount of heat during operation. In a computer system, a CPU generally is attached with a heat dissipation device so as to remove the heat generated by the CPU. Such a heat dissipation device generally includes a plurality of metal fins used for increasing the total heat dissipating surface area of the heat dissipation device. Recently, heat pipes have been combined to heat dissipation devices in order to enhance heat removal.

FIG. 5 shows a heat dissipation device 10 suitable for removing heat from a heat generating electronic component (not shown). The heat dissipation device 10 includes a plurality of metal fins 12 and at least one heat pipe 14 combined to the metal fins 12. More specifically, each of the metal fins 12 defines therein at least one aperture 121 for extension of the heat pipe 14, as shown in FIG. 6. An annular extension flange 123 projects outwardly from the metal fin 12, surrounding the aperture 121. Conventionally, the heat pipe 14 is soldered to the metal fins 12 using a thermal medium material, i.e. a material with high thermal conductivity. The thermal medium material used to solder the heat pipe 14 to the metal fins 12 is preferably in the form of viscous solder paste and composed of a metal alloy such as tin (Sn) or silver (Ag) together with some kind of flux such as rosin flux. The rosin flux added to the thermal medium material is used to remove the oxidized layers formed and contaminants deposited on the contacting surfaces between the metal fins 12 and the heat pipe 14 so as to effectively solder the heat pipe 14 to the metal fins 12.

In the soldering process, the rosin content contained in the thermal medium material needs to be discharged in order not to affect the quality of the joint between the heat pipe 14 and the metal fins 12. However, after the metal fins 12 are stacked together, the extension flanges 123 are aligned to form a hermetically sealed cylinder in which the heat pipe 14 is positioned. There are no channels or passageways available for discharge of the rosin content during or after the soldering process. As a result, the rosin content contained in the thermal medium material is left between the heat pipe 14 and the metal fins 12, which can affect the heat exchange efficiency of the heat dissipation device 10.

Therefore, it is desirable to provide a heat dissipation device which overcomes the foregoing disadvantages.

SUMMARY OF INVENTION

The present invention relates to a heat dissipation device for dissipating heat from a heat generating component. The heat dissipation device includes at least one heat pipe and a plurality of metal fins thermally connected to the heat pipe. Each of the metal fins defines an aperture therein. An extension flange extends outwardly from the metal fin and surrounds the aperture. The extension flange defines therein a plurality of slits. The apertures and extension flanges of the metal fins are aligned together. The heat pipe is received in the aligned apertures and soldered by a thermally conductive material to the metal fins via the aligned extension flanges. In the present heat dissipation device, rosin content contained in the thermally conductive material is capable of being released during the soldering process via the slits formed in the extension flange.

Other advantages and novel features of the present invention will become more apparent from the following detailed description of preferred embodiment when taken in conjunction with the accompanying drawings, in which:

DETAILED DESCRIPTION

Figure 1:
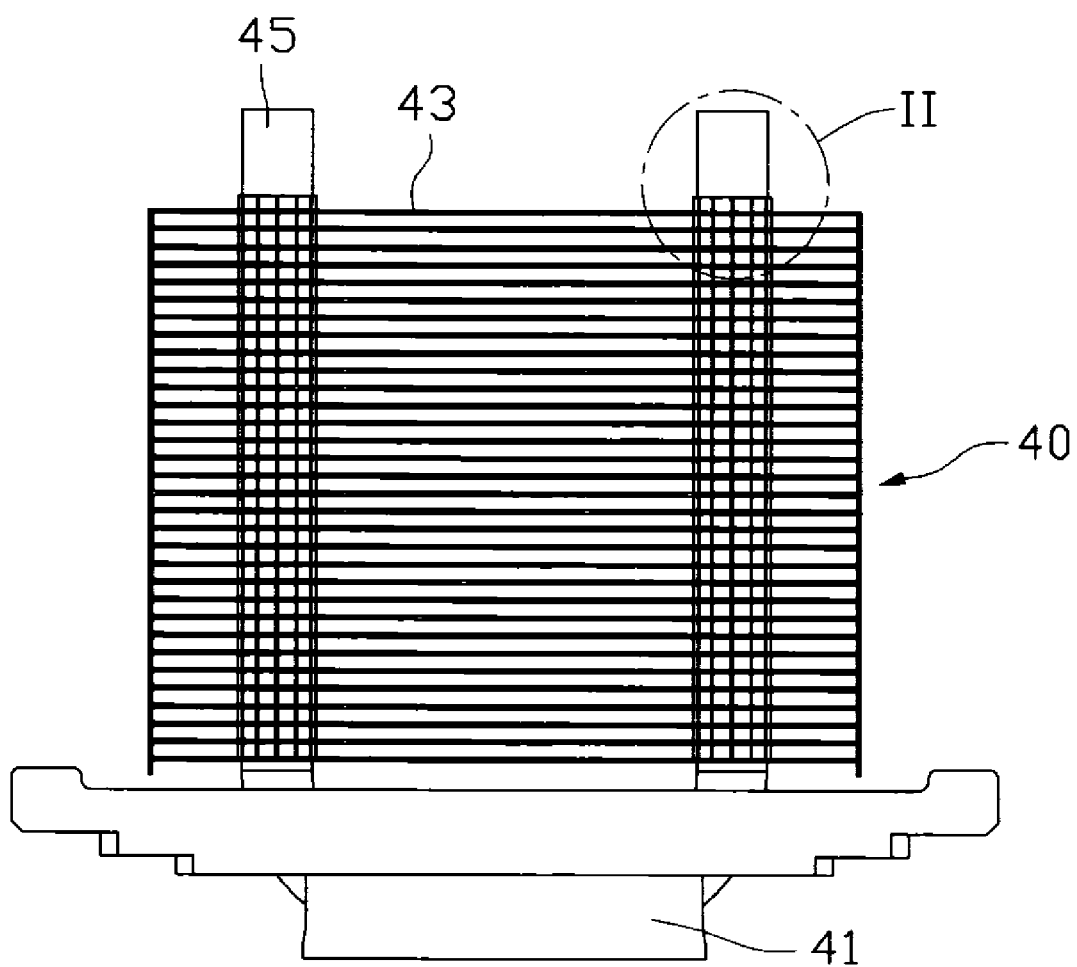
FIG. 1 is a side elevation view of a heat dissipation device in accordance with an embodiment of the present invention.

FIG. 1 illustrates a heat dissipation device 40 in accordance with an embodiment of the present invention. The heat dissipation device 40 includes a base 41, a plurality of metal fins 43 arranged above the base 41 and at least one heat pipe 45 thermally connecting the base 41 with the metal fins 43. The base 41 and the metal fins 43 are made of highly thermally conductive material such as copper, copper alloys, aluminum or aluminum alloys. The base 41 is used to thermally contact with a heat generating component, for example a CPU of a computer system, so as to absorb heat generated by the heat generating component. The metal fins 43 are spaced apart from each other in a stacked manner. The heat absorbed by the base 41 is then transferred by the heat pipe 45 to the fins 43 where the excessive heat is dissipated to ambient environment.

Figure 2:
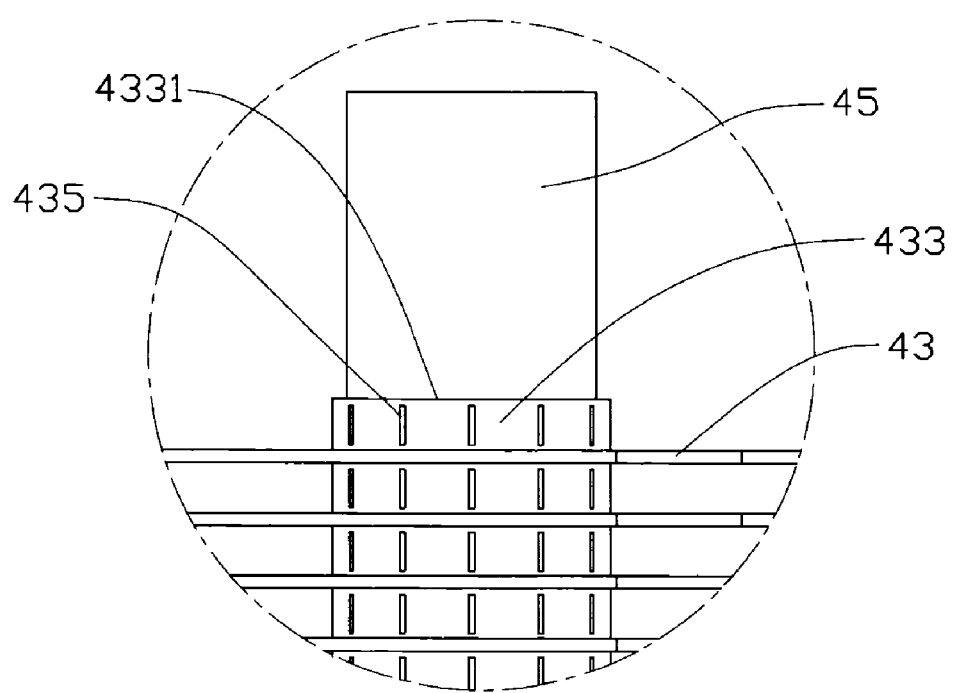
FIG. 2 is an enlarged view of a circled portion II of FIG. 1.
Figure 4:
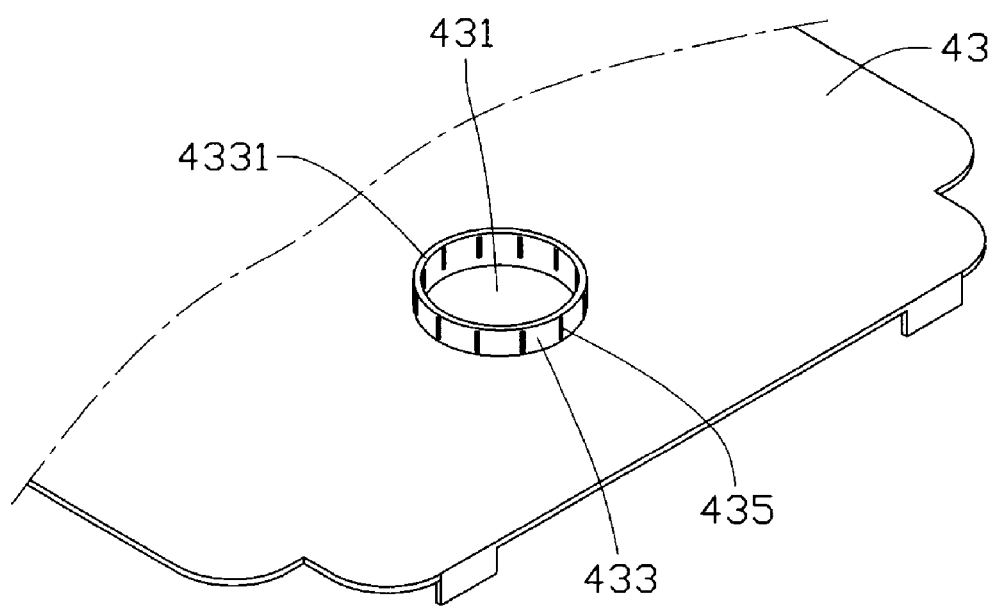
FIG. 4 is similar to FIG. 3, but an extension flange is formed as projecting outwardly from the metal fin.
Figure 5:
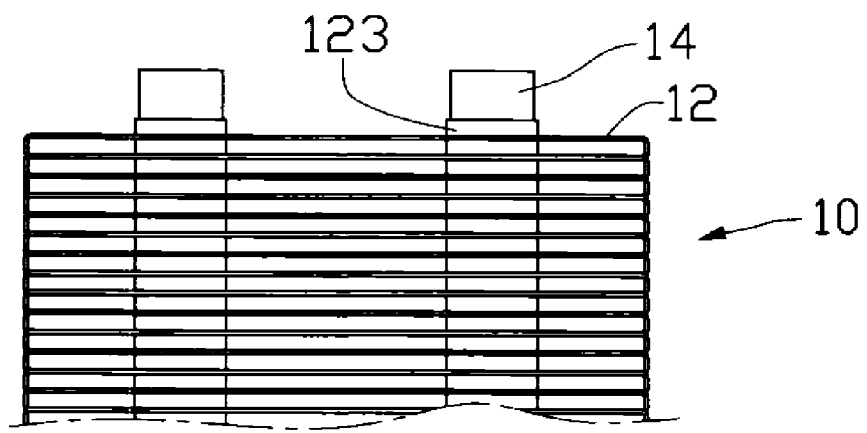
FIG. 5 is a side elevation view of a heat dissipation device in accordance with the conventional art.
Figure 6:
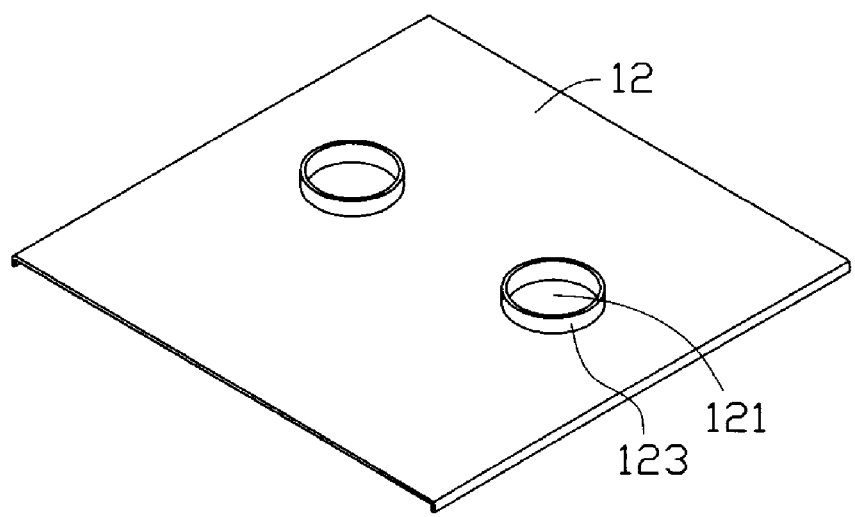
FIG. 6 is an isometric view of a metal fin of the heat dissipation device of FIG. 1.

With reference to FIGS. 2 and 4, each of the metal fins 43 defines therein a round aperture 431 and an annular extension flange 433 is provided as projecting outwardly from the metal fin 43 such that the metal fins 43 are spaced apart from one another by the extension flanges 431. The extension flange 433 serves to maintain a specified distance between the adjacent fins 43 and for increasing the contacting surface area between the fins 43 and the heat pipes 45. As the metal fins are stacked together, the apertures 431 and the extension flanges 431 are aligned together to collectively receive the heat pipe 45 therein. Meanwhile, a plurality of slits 435 is defined in the extension flange 431 around a circumferential surface thereof. The slits 435 are evenly spaced from each other and each of the slits 435 is defined through the extension flange 433. The extension flange 433 extends perpendicularly from the metal fin 43, and the slits 435 have an elongated structure and extend in parallel to the extension flange 433. The slits 435 extend along a height direction of the extension flange 433. The extension flange 433 has a distal end portion 4331. Each of the slits 435 is preferably dimensioned not to reach the distal end portion 4331 so that the slits 435 are separated from the distal end portion 4331 by a specified distance, as shown in FIG. 2. Furthermore, the slits 435 do not reach the metal fin 43.

The heat pipe 45 is received in the aligned apertures 431 of the metal fins 43 and soldered to the aligned extension flanges 433 by a thermal medium material such as solder paste or solder wires. Typically, such thermal medium material contains rosin flux in order to increase the quality of soldering between the metal fins 43 and the heat pipe 45. As the heat pipe 45 is soldered to the metal fins 43, thermal medium material containing rosin flux is applied to contacting surfaces between the heat pipe 45 and the fins 43. For example, if the thermal medium material used is solder paste, the solder paste may be applied to the outer circumferential surface of the heat pipe 45 before the heat pipe 45 is inserted into the aligned apertures 431. Alternatively, before the heat pipe 45 is inserted into the aligned apertures 431, the solder paste may also be spread over the inner surfaces of the aligned extension flanges 433. Then, the metal fins 43 in combination with the heat pipe 45 are heated so as to solder the heat pipe 45 to the metal fins 43 with the thermal medium material. After the heat dissipation device 40 is cooled down, the heat pipe 45 is physically and thermally connected to the metal fins 43 by the thermal medium material.

During the soldering process described above, the rosin flux added to the thermal medium material may react with, for example, oxidized layers formed, or contaminants deposited on the outer circumferential surface of the heat pipe 45 and inner surfaces of the aligned extension flanges 433. After this chemical reaction, unwanted chemical products, for example, residue or bubbles, which result from the rosin flux are discharged from the contacting surfaces of the heat pipe 45 and the metal fins 43 via the slits 435. In the present heat dissipation device 40, since the rosin content contained in the thermal medium material is removed through the slits 435 after the soldering process, the metal fins 43 and the heat pipe 45 are combined together more effectively. After the soldering process, the solder solidify at the contacting surfaces of the heat pipe 45 and the extension flanges 433 of the fins 43 and in the slits 435.

Figure 3:
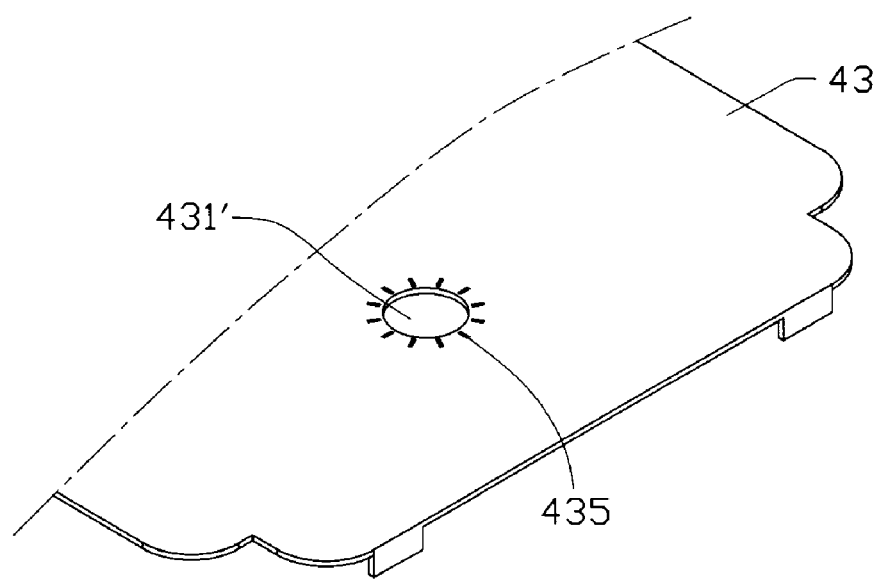
FIG. 3 is a fragmentary, isometric view of a metal fin with a plurality of slits formed therein.

The extension flanges 433 and slits 435 of the metal fins 43 typically are formed by a stamping method. As illustrated in FIG. 3, the metal fin 43 is firstly stamped to form a round aperture 431', and a plurality of spaced slits 435 are defined in the fin body of the metal fin 43. These slits 435 are spaced apart from each other evenly and are formed as circumferentially surrounding the aperture 431'. However, these slits 435 do not communicate with the aperture 431'. Thereafter, the particular portion of the metal fin 43 where the slits 435 are formed is stamped perpendicularly outwardly so as to form the extension flange 433, as shown in FIG. 4. This stamping step forms an enlarged round aperture 431, which is surrounded by the extension flange 433. The aperture 431 is of a size slightly larger than a diameter of the heat pipe 45. According to shape of the heat pipe 45, the aperture 431 may be configured to have other shapes such as rectangular. Besides the stamping method mentioned above, it is well known by those skilled in the art that the slits 435 and the extension flange 433 may also be formed by other suitable methods.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device comprising:
   a heat pipe; and
   a plurality of metal fins thermally connected to the heat pipe, each of said metal fins defining therein an aperture, an extension flange extending outwardly from each of said metal fins and surrounding the aperture, the extension flange defining therein a plurality of slits, the apertures and extension flanges of said metal fins being aligned with one another, said heat pipe being received in the aligned apertures and soldered by a thermal medium material to the metal fins via the aligned extension flanges;
   wherein the extension flange has a distal end portion and the slits in the extension flange are separated from the distal end portion.

2. The heat dissipation device of claim 1, wherein the slits are defined around the extension flange and are evenly spaced from each other.

3. The heat dissipation device of claim 1, wherein the extension flange extends perpendicularly from the metal fin and the slits extend in the extension direction of the extension flange.

4. The heat dissipation device of claim 1, wherein the extension flange of each of said metal fins contacts with a fin body of an adjacent metal fin.

5. The heat dissipation device of claim 1, wherein the aperture is round in shape and the extension flange has an annular configuration.

6. The heat dissipation device of claim 1, wherein the thermal medium material is in the form of a paste.

7. A heat dissipation device comprising:
   a fin defining an aperture therethrough and comprising an extension flange surrounding the aperture, the extension flange defining a plurality of voids therein, each of the voids neither reaching an end of the extension flange distant from the fin nor reaching the fin;
   a heat pipe extending through the aperture; and
   solder provided on contacting surfaces of the heat pipe and the extension flange and in the voids, the solder thermally and mechanically connecting the heat pipe and the extension flange of the fin together.

8. The heat dissipation device of claim 7, wherein the voids are slits.

9. The heat dissipation device of claim 8, wherein the slits extend along a height direction of the extension flange.

10. The heat dissipation device of claim 9, wherein the slits are equidistant from each other.

* * * * *